United States Patent [19]
Nishikawa

[11] Patent Number: 5,821,610
[45] Date of Patent: Oct. 13, 1998

[54] LEADFRAME ALLOWING EASY REMOVAL OF TIE BARS IN A RESIN-SEALED SEMICONDUCTOR DEVICE

[75] Inventor: Hideyuki Nishikawa, Tokyo, Japan

[73] Assignee: NEC Corporation, Tokyo, Japan

[21] Appl. No.: 891,831

[22] Filed: Jul. 14, 1997

Related U.S. Application Data

[63] Continuation of Ser. No. 587,500, Jan. 17, 1996, abandoned.

[30] Foreign Application Priority Data

Jan. 18, 1995 [JP] Japan ................................. 7-005495

[51] Int. Cl.$^6$ ........................... H01L 23/28; H01L 23/50; H01L 23/48
[52] U.S. Cl. ........................ 257/670; 257/666; 257/671; 257/669; 257/674
[58] Field of Search .................... 257/666, 670, 257/669, 671, 698, 700, 787, 674, 672

[56] References Cited

U.S. PATENT DOCUMENTS

| | | | |
|---|---|---|---|
| 5,126,824 | 6/1992 | Ueda .................................... | 257/702 |
| 5,176,366 | 1/1993 | Masumoto et al. .................... | 257/670 |
| 5,285,104 | 2/1994 | Kondo et al. ......................... | 257/670 |
| 5,486,722 | 1/1996 | Sata et al. ............................. | 257/787 |
| 5,587,606 | 12/1996 | Sekiba .................................. | 257/670 |
| 5,610,437 | 3/1997 | Frechette ............................. | 257/670 |
| 5,637,914 | 6/1997 | Tanaka et al. ........................ | 257/671 |

FOREIGN PATENT DOCUMENTS

| | | | |
|---|---|---|---|
| 59-36955 | 2/1984 | Japan | 257/670 |
| 63-70548 | 3/1988 | Japan | 257/670 |
| 63-107052 | 5/1988 | Japan | 257/670 |
| 63-131557 | 6/1988 | Japan | 257/670 |
| 1-201945 | 8/1989 | Japan | 257/670 |
| 2-97048 | 4/1990 | Japan | 257/670 |
| 2-294058 | 12/1990 | Japan | 257/670 |
| 4-25058 | 1/1992 | Japan | 257/670 |
| 4-139868 | 5/1992 | Japan . | |
| 4-164356 | 6/1992 | Japan . | |
| 4-199564 | 7/1992 | Japan | 257/690 |
| 4-218951 | 8/1992 | Japan . | |
| 5315508 | 11/1993 | Japan . | |
| 7-321135 | 12/1995 | Japan . | |

*Primary Examiner*—Tom Thomas
*Assistant Examiner*—Alexander Oscar Williams
*Attorney, Agent, or Firm*—Foley & Lardner

[57] ABSTRACT

Resin tie bars are formed between leads of external leads extending out from a resin-sealed region. The external leads are formed such that lead width at portions beyond the portion where the resin tie bars are formed is less than the lead width at portions where the resin tie bars are formed. With this construction, resin extending between the leads from the periphery of the resin-sealed region, including the resin tie bars, can be easily removed after resin-sealing when the resin tie bars are subjected to water sprayed at high pressure.

1 Claim, 6 Drawing Sheets

LEADFRAME ALLOWING EASY REMOVAL OF TIE BARS IN A RESIN-SEALED SEMICONDUCTOR DEVICE

This application is a continuation of application Ser. No. 08/587,500, filed Jan. 17, 1996, now abandoned.

BACKGROUND OF THE INVENTION

1. Field of the Invention

The present invention relates to a leadframe of a resin-sealed semiconductor device, and to a manufacturing method of a resin-sealed semiconductor device.

2. Description of the Related Art

In leadframes of resin-sealed semiconductor devices of the prior art, tie bars are provided between external leads to check leakage of resin from gaps between the upper and lower dies at the time of resin molding. These tie bars are commonly cut away using a cutting die after resin sealing. In addition, hardened resin that has leaked from the periphery of the resin-sealed region into the area between tie bars is commonly removed by high-pressure water using a wet honing device. In such a case, however, the strength of adhesion between the leadframe and sealing resin complicates the total removal by water under high pressure. Japanese Patent Laid-open 164356/92 discloses one countermeasure for this problem.

FIG. 1 is a partial plan view showing a leadframe of the prior-art resin-sealed semiconductor device described in Japanese Patent Laid-open No. 164356/92. In the-prior-art leadframe shown in FIG. 1, resin generated between the periphery 5 of the resin-sealed region and tie bars 1 at the time of sealing can be easily removed by forming a material 4 having poor adhesion with the sealing resin on the side surfaces of external leads 2 existing between the periphery 5 of the resin-sealed region and tie bars 1.

Decrease in the lead pitch of external leads in a semiconductor device also complicates removal of tie bars by cutting using a tie-bar cutting die of the prior art. In other words, a smaller lead pitch requires a narrower punch for cutting away tie bars, and the consequent reduction of mechanical strength of the punch results in the problem of easy breakage.

A solution is proposed in Japanese Patent Laid-open No. 139868/92 according to which the tie bars themselves are eliminated.

FIG. 2 is a plan view showing a prior-art leadframe according to a resin-sealed semiconductor device disclosed in Japanese Patent Laid-open No. 139868/92. As shown in FIG. 2, resin (hereinafter identified as "resin tie bars") that performs the same function as tie bars is formed between external leads 2. At the time of resin sealing, sealing resin is dammed by these resin tie bars 3. These resin tie bars 3 are generally removed following resin sealing. If the resin tie bars 3 are left as is, they may cause deformation of the leads during a lead forming process, or they may separate from between the leads and be pressed into the lead surface during a lead forming process. A common method of removing the resin tie bars is to subject them to high-pressure water using a water honing device.

However, the leadframe shown in FIG. 2 has the following drawback. FIG. 3 is a sectional view of leads of the leadframe shown in FIG. 2, and FIG. 4 is a partial plan view of the leadframe shown in FIG. 2. A resin-sealed semiconductor device in which the resin tie bars are applied ordinarily has a small lead pitch that complicates cutting of tie bars, and such a leadframe for a resin-sealed semiconductor device having a small lead pitch is manufactured using an etching process instead of a press process. As shown by the sectional view of FIG. 3, which shows leads of a leadframe manufactured by etching, the leads do not have a rectangular shape, but rather, have a curved surface on the inner surfaces between leads.

As a result, when subjected to high-pressure water to remove the resin tie bars after resin sealing, the resin tie bars 3 in some cases are supported by the inwardly curving portions of the leads and merely slide between the leads as shown in FIG. 4 and do not fall away. Resin tie bars that cannot be eliminated and remain between the leads may cause lead deformation during a lead forming process, or the resin-may separate and be pressed into the surface of leads, resulting in defective articles.

The application of the previously-described technique of Japanese Patent Laid-open No. 164356/92, in which a substance having poor adhesion is formed on the lead side surfaces, provides no solution to this problem because resin tie bars may remain between leads in the same way regardless of adhesion between the resin and leadframe.

SUMMARY OF THE INVENTION

In view of the above-described problems of the prior art, the object of the present invention is to provide a leadframe of a resin-sealed semiconductor device, as well as a manufacturing method of a resin-sealed semiconductor device, that allows easy removal of resin beyond the periphery of the resin-sealed region between leads, including resin tie bars, after resin sealing in a leadframe in which resin is formed in place of tie bars to provide the same function as tie bars.

To achieve the above-described object, the present invention is characterized in that, in a leadframe of a resin-sealed semiconductor device having a tie bar made from resin between leads extending from the resin-sealed region, the gap between leads at a portion where a resin tie bar is formed differs from the gap between the leads at a point further toward the outside from the portion where the resin tie bar is-formed so as to facilitate removal of the resin tie bar between the leads.

As an example, leads are formed narrower at portions extending further toward the outside from the portion where the above-described tie bar is formed than the width of the leads at the portion where the above-described tie bar is formed.

According to a method of manufacturing resin-sealed semiconductor device using the above-described leadframe, the above described tie bar is removed by high-pressure water following sealing of the resin-sealed region.

In other words, lead width is narrower at points further toward the outside from a portion where a resin tie bar is formed than lead width at the portion where the resin tie bar is formed, and consequently, the space between leads at portions where the tie bar is not formed is wider than the tie bar itself. As a result, when subjected to high-pressure water, the resin tie bar moves between the leads while being supported by the curved portions of the side surfaces of the leads, and then easily falls away from the leads at a point where the space between leads is wider than the tie bar.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

Figure 5:
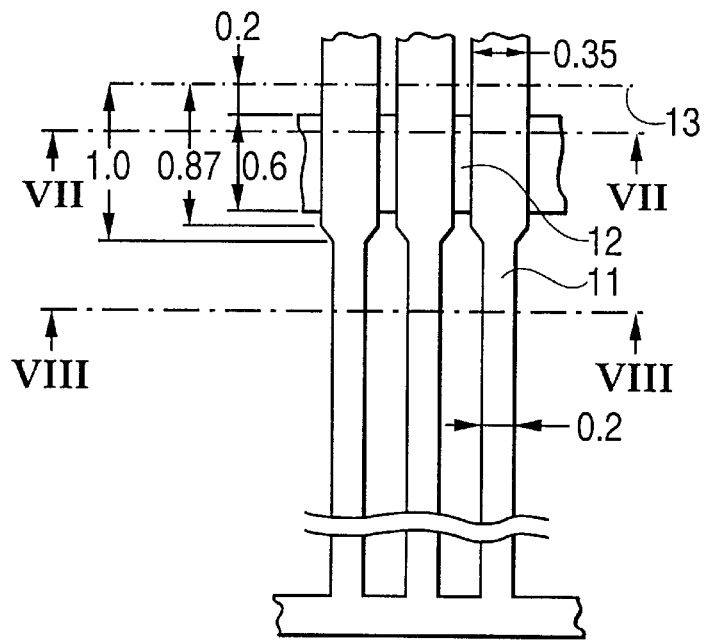
FIG. 5 is a partial plan view showing a characteristic portion of the first embodiment of a leadframe of a resin-sealed semiconductor device according to the present invention.
Figure 7:
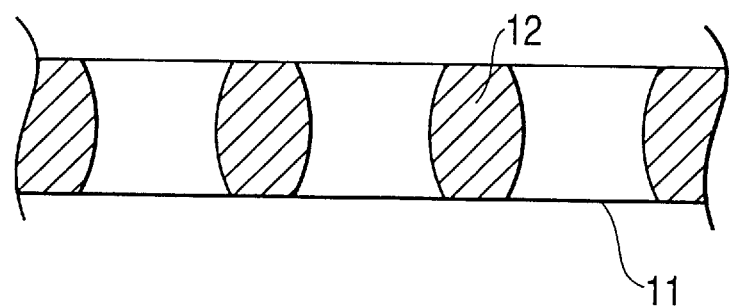
FIG. 7 is a sectional view taken at line VII—VII of the leadframe shown in FIG. 5.
Figure 8:
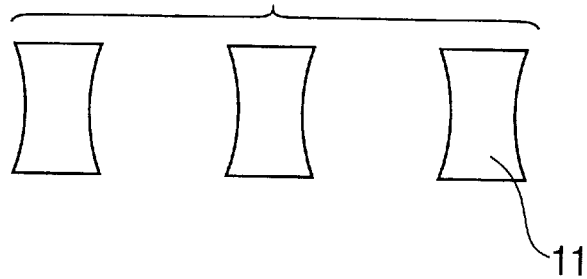
FIG. 8 is a sectional view taken at line VIII—VIII of the leadframe shown in FIG. 5.

Embodiments of the present invention will next be explained with reference to the accompanying figures, beginning with the first embodiment. The leadframe of the first embodiment is used in a 160-pin QFP (Quad Flat Package) having a lead pitch of 0.5 mm. As shown in FIG. 5, resin is formed between the leads of external leads 11 to effect the same function as a tie bar, and is thus termed resin tie bar 12. External leads 11 are formed by an etching process, and the inner side surfaces between the leads consequently have a curved shape as shown in the lead sections of FIG. 7 and FIG. 8. As a result, resin tie bar 12 is in a supported state between the curved portions of the lead side surfaces (refer to FIG. 7).

External leads 11, which extend toward the outside from the resin-sealed region, are formed such that lead width at portions farther toward the exterior from the position of formation of resin tie bar 12 is narrower than lead width at the portion where resin tie bar 12 is formed. Consequently, the space between external leads beyond resin tie bar 12 is wider than the space between leads at the portion where resin tie bar 12 is formed. This wider space between leads becomes the space for removing resin tie bar 12.

In the first embodiment, the width of external leads 11 is a uniform 0.35 mm to a distance of 0.87 mm from the periphery 13 of the resin-sealed region. From this point, the lead width is reduced to a point at a distance of 1.0 mm from the periphery 13 of resin-sealed region, and at points beyond 1.0 mm from the periphery 13 of the resin-sealed region, the lead width is a uniform 0.2 mm. In addition, resin tie bar 12 between external leads 11 is formed over a distance of 0.6 mm beginning from a point 0.2 mm from the periphery 13 of the resin-sealed region.

Figure 1:
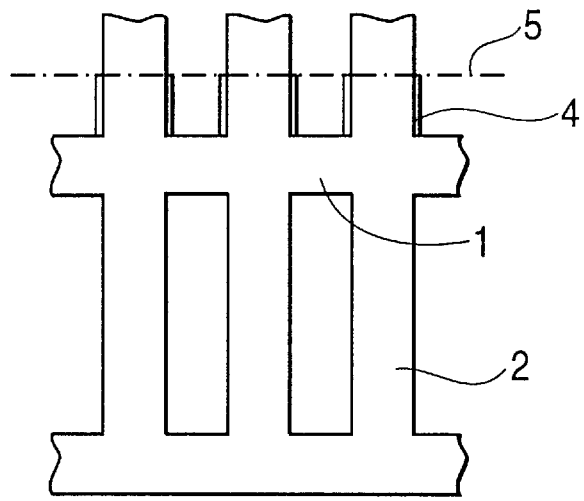
FIG. 1 is a partial plan view showing a leadframe of a prior-art resin-sealed semiconductor device described in Japanese Patent Laid-open No. 164356/92.
Figure 2:
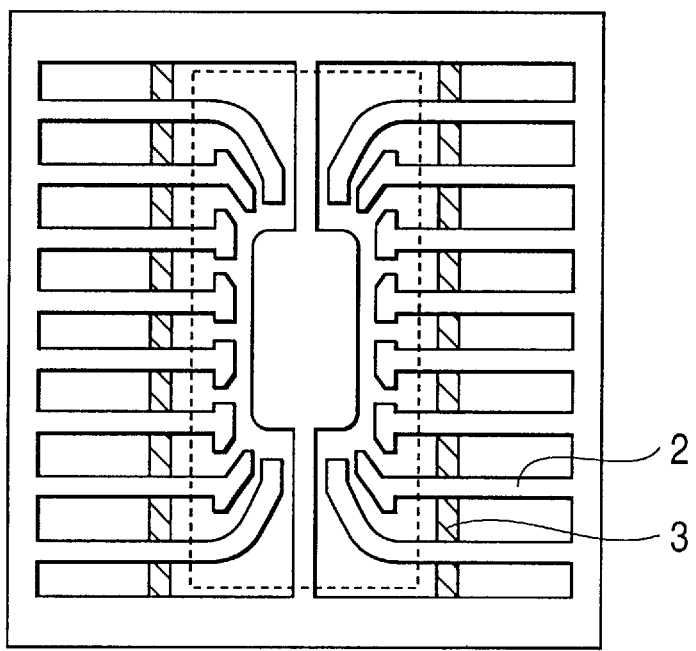
FIG. 2 is a plan view of a leadframe of a prior-art resin-sealed semiconductor device described in Japanese Patent Laid-open No. 139868/92.
Figure 3:
FIG. 3 is a sectional view of leads of the leadframe shown in FIG. 2.
Figure 4:
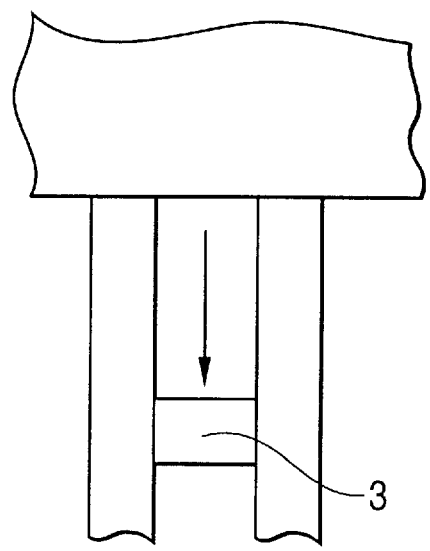
FIG. 4 is a partial plan view of the leadframe shown in FIG. 2.
Figure 9:
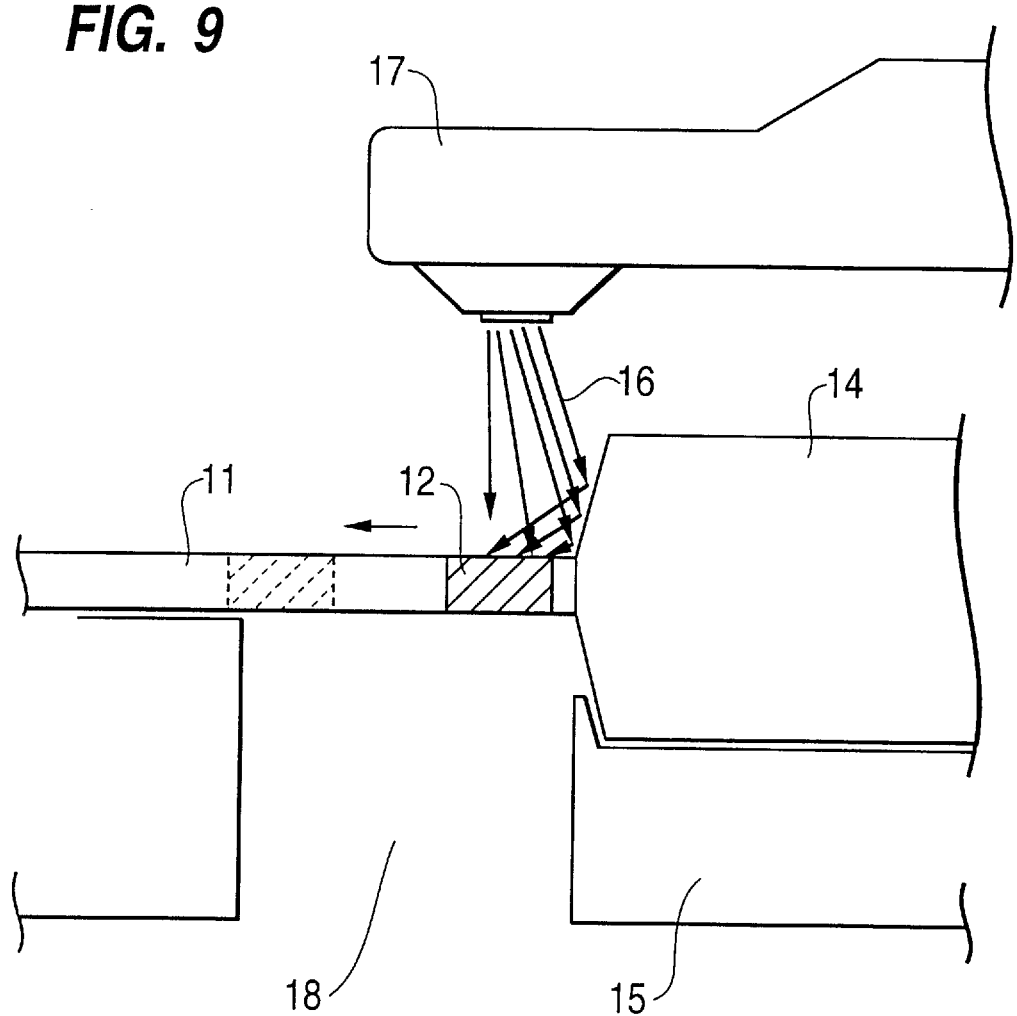
FIG. 9 shows the manner in which a resin tie bar is removed in a leadframe according to the present invention.

When a semiconductor device employing the leadframe shown in FIG. 1 is fabricated, sealing resin is checked by resin tie bar 12 formed between external leads 11. The semiconductor device package body 14 and external leads 11 are subsequently secured in cradle 15 as shown in FIG. 9, and high-pressure water 16 is sprayed through nozzle 17 against the side walls of the package body 14 and the bases of external leads 11. The high-pressure water strikes the side walls of package body 14, is reflected back, and pushes resin tie bars 12 toward the outside, whereupon the resin tie bars 12 pass through a drainage passage provided in cradle 15 and are removed.

When subjected to the high-pressure water spray, resin tie bars 12 move between the leads while being supported by the curved portions in the lead side surfaces caused by etching, but in contrast with the prior-art construction, resin tie bars 12 then readily fall away from the leads because the lead spacing beyond the portion where resin tie bars 12 are formed is wider than the lead spacing at the resin tie bar 12 formation position. In addition, sealing resin occurring between the periphery 13 of the resin-sealed region and resin tie bars 12 is also similarly removed by the high-pressure water.

The second embodiment of the present invention will next be explained. The second embodiment shown in FIG. 6, as in the first embodiment, is used in a 160-pin QFP having a lead pitch of 0.5 mm.

In the second embodiment, the lead width of external leads 21 is 0.35 mm at the periphery 23 of the resin-sealed region, gradually decreases with distance from the periphery 23 of the resin-sealed region, and becomes a uniform 0.2 mm beyond a point 2 mm from the periphery 23 of the resin-sealed region. In addition, resin tie bar 22 between the leads is formed over a distance of 0.6 mm beginning from a point 0.2 mm from the periphery 23 of the resin-sealed region.

As a result, in contrast to the first embodiment, the external leads are not stepped between the lead bases and lead ends. When the leads are formed in this way, removability of the tie bars when spraying with high-pressure water as shown in FIG. 9 is as for the first embodiment, but the absence of sudden variations in lead width is advantageous for ensuring consistency in lead bending.

Figure 10:
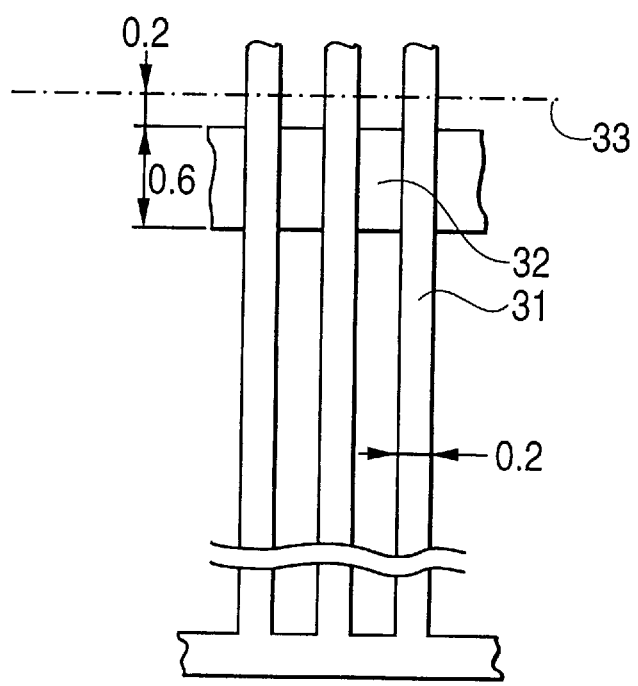
FIG. 10 shows a partial plan view of a leadframe of the prior art for purposes of comparison with the first and second embodiments of the present invention.

The results of actual assessment of leadframes according to the first and second embodiments will next be explained. FIG. 10 is a partial plan view of a prior-art leadframe for purposes of comparison with the first and second embodiments.

The leadframe employed for purposes of comparison in the assessment was for a 160-pin QFP and had a lead pitch of 0.5 mm, external leads 31 having a uniform width of 0.2 mm, with resin tie bars 32 being formed between the external leads 31 over a distance of 0.6 mm beginning from a point 0.2 mm from the periphery 33 of the resin-sealed region, as shown in FIG. 10.

Figure 6:
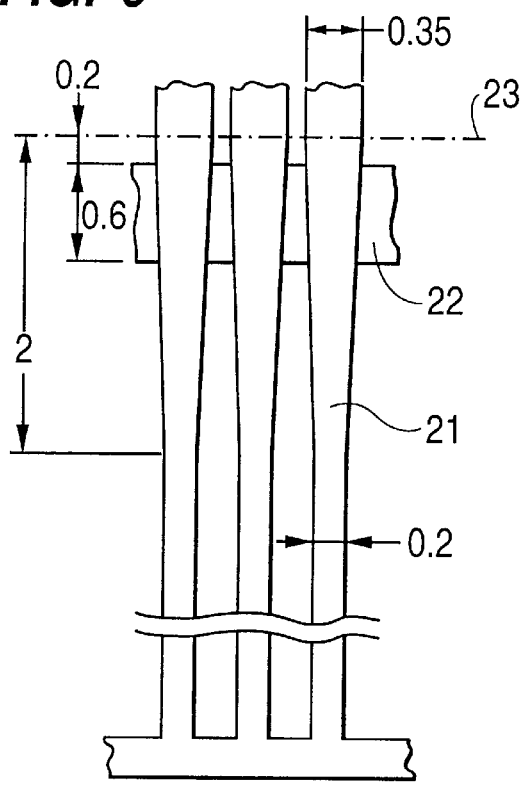
FIG. 6 is a partial plan view showing the second embodiment of a leadframe of a resin-sealed semiconductor device according to the present invention.

These three types of leadframes, according to the prior-art technique, the first embodiment, and the second embodiment, were each resin sealed, following which the resin between the external leads was removed using water sprayed at a high pressure of 200 kg/cm$^2$. The resulting rates of occurrence of resin remnants per semiconductor device units was:

100% for leadframes according to the prior art shown in FIG. 10 (60 occurrences/60 units);

0% for leadframes according to the first embodiment shown in FIG. 5 (0 occurrences/60 units); and 0% for leadframes according to the second embodiment shown in FIG. 6 (0 occurrences/60 units). These results confirm the effectiveness of the present invention.

According to the present invention, the lead width at points of leads extending beyond the portion where resin tie bars are formed is smaller than the lead width at the portion where the resin tie bars are formed, and the gaps between external leads at points beyond the resin tie bars is accordingly wider than the gaps between the leads at the portion where the resin tie bars are formed. In this way, resin can be removed from between leads after resin sealing even in the case of leadframes formed by an etching process, thereby preventing the occurrence of lead deformation or resin being impressed into leads when forming leads brought about by resin remnants between leads.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A leadframe of a resin-sealed semiconductor device, comprising:

a resin-sealed region, said resin-sealed region having an outer periphery;

a plurality of leads extending outwardly from said resin-sealed region; and resin tie bars extending between said leads outside of said resin-sealed region and spaced with a gap between said resin tie bars and the outer periphery of said resin-sealed region, wherein said leads each taper from a first width at an inner edge of said resin tie bars to a second width smaller than said first width at an outer edge of said resin tie bars, and to a third width smaller than said second width at a position outside of said resin tie bars, wherein a distance between said resin tie bars and said position outside of said resin tie bars at which said leads have the third width is sufficiently small to allow said resin tie bars to be readily moved outwardly to said position upon application of water pressure within said gap and dislodge said tie bars from between said leads.

* * * * *